(12) United States Patent  (10) Patent No.: US 7,453,189 B2
Nakagawa et al.  (45) Date of Patent: Nov. 18, 2008

(54) PIEZOELECTRIC TRANSFORMER

(75) Inventors: Ryo Nakagawa, Tokyo (JP); Yasuhide Matsuo, Tokyo (JP)

(73) Assignee: Tamura Corporation, Tokyo (JP)

( * ) Notice: Subject to any disclaimer, the term of this patent is extended or adjusted under 35 U.S.C. 154(b) by 0 days.

(21) Appl. No.: 11/595,499

(22) Filed: Nov. 10, 2006

(65) Prior Publication Data

US 2007/0103036 A1   May 10, 2007

(30) Foreign Application Priority Data

Nov. 10, 2005   (JP) .............................. 2005-325887

(51) Int. Cl.
*H01L 25/00* (2006.01)
(52) U.S. Cl. ...................... 310/359; 310/363; 310/364; 310/365
(58) Field of Classification Search .................. 310/365, 310/359
See application file for complete search history.

(56) References Cited

U.S. PATENT DOCUMENTS 5,777,425 A * 7/1998 Ino et al. ..................... 310/359

FOREIGN PATENT DOCUMENTS

JP   2004-119416 A   4/2004

* cited by examiner

*Primary Examiner*—Thomas M. Dougherty
*Assistant Examiner*—Bryan P Gordon
(74) *Attorney, Agent, or Firm*—Dennis G. LaPointe

(57) ABSTRACT

There is provided with a piezoelectric transformer which does not require a marking operation, is easy to manufacture, and is capable of reducing costs. After the piezoelectric transformer is manufactured, a shape of secondary side electrodes on the outer end is made so that a polarization direction can be recognized at the time of printing the secondary side electrodes without marking by a separate step to recognize the polarity on the primary side.

2 Claims, 3 Drawing Sheets

PIEZOELECTRIC TRANSFORMER

BACKGROUND OF THE INVENTION

1. Field of the Invention

The present invention relates to a piezoelectric transformer using a piezoelectric ceramics as an element for generating high voltage, and as an element for converting voltage.

2. Description of the Related Art

A piezoelectric transformer using a piezoelectric ceramics is widely used for a light source for a backlight which illuminates from a rear side a liquid crystal used in a personal computer and the like, used for a DC/DC converter of a power supply, and for a high-voltage power source of an air cleaner and the like. This kind of piezoelectric transformer is obtained by providing primary and secondary electrodes to a piezoelectric ceramics such as PZT, and polarizing it by applying a high electric field to the respective electrodes to align crystal axes.

Conventionally, in a general piezoelectric transformer, as shown in FIG. 6, primary side electrodes 3' are provided by printing on the top and bottom surfaces of one half of an elongated piezoelectric ceramics 2' having a rectangular shape viewed from the upper side, and secondary side electrodes 4' having a rectangular shape are similarly provided by printing at the outer ends of the top and bottom surfaces in the other half.

In this piezoelectric ceramics 2', a generating part between the primary side electrodes 3' is polarized, for example, in a direction shown by an arrow a, and an output part side at the other half part is polarized, for example, in a direction shown by an arrow b. A piezoelectric transformer 1' is configured by such polarizations.

In the piezoelectric transformer 1', when a voltage with a unique resonant frequency decided by a longitudinal direction of the primary side of the transformer is applied, elements are vibrated by counter-piezoelectric effect, and a positive or negative voltage corresponding to the vibrations can be picked up from the secondary side by piezoelectric effect. The characteristics of the transformer can be changed by changing a polarization direction.

SUMMARY OF THE INVENTION

Conventionally, there is a problem that, to indicate a polarization direction a on a generating part side, a marking with a suitable shape is applied to the piezoelectric transformer 1' at predetermined positions in a separate marking step, which leads to that manufacture is complicated and costs become increased.

The present invention is made in view of the above-mentioned problem, and an object of the present invention is to provide a piezoelectric transformer which does not require a marking operation, is easy to manufacture, and is capable of reducing costs.

In the invention described in claim 1, a secondary side electrode provided at an end of at least one face of a piezoelectric ceramics is formed into a shape for indicating a polarity.

The invention described in claim 2 is the piezoelectric transformer described in claim 1, wherein an inner shape of the secondary side electrode is a linear shape extending substantially in a width direction of the piezoelectric ceramics, and an outer shape of the secondary side electrode is a polarity-recognizable shape which is different from the linear inner shape.

According to the inventions described in claims 1 and 2, the polarity on the primary side of the piezoelectric ceramics can be known by the electrode shape on the secondary side, so that there is no need for adding a separate step to apply markings, and therefore the transformer can be manufactured more easily.

Also, since the secondary side electrode can be easily provided by one printing, costs can be reduced.

DETAILED DESCRIPTION OF THE PREFERRED EMBODIMENTS

Figure 1A:
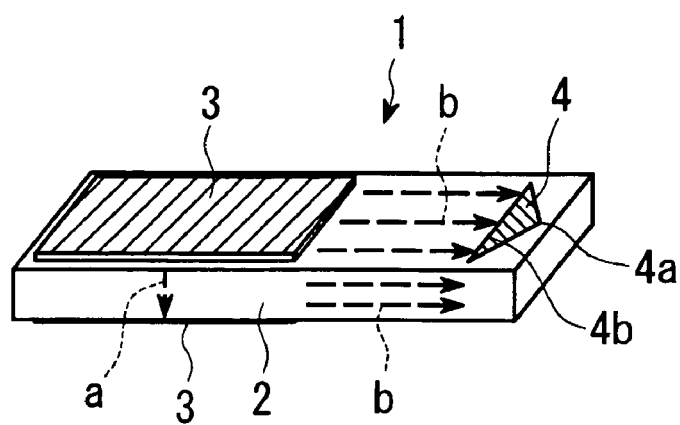
FIG. 1A is a perspective view of a piezoelectric transformer in a first embodiment of the present invention.

Now, embodiments of the present invention will be explained with reference to the drawings.

Embodiment 1

FIG. 1 is a perspective view of a piezoelectric transformer in a first embodiment of the present invention.

In this piezoelectric transformer 1, primary side electrodes 3 are provided on the top and bottom surfaces of a piezoelectric ceramics 2 on a generating part side or input side by printing, respectively.

Also, secondary side electrodes 4 are provided by printing at the ends of the top and bottom surfaces of the piezoelectric ceramics 2 on an output part side. In this embodiment, at least one secondary side electrode 4 has a substantially triangular shape The generating part between the primary side electrodes 3 on the top and bottom surfaces is polarized, for example, in a direction of the arrow a, and the output part is polarized in a direction of the arrows b.

According to the present invention, the polarization direction a between the primary side electrodes 3 is made recognizable by printing the substantially triangular secondary side electrode 4, for example, with its peak 4a directed to the outside of the piezoelectric ceramics 2 and printed, so that . That is to say, the polarity on the primary side of the piezoelectric ceramics 2 is made recognizable. Accordingly, there is no need to apply markings by a separate step as in prior art.

Figure 1B:
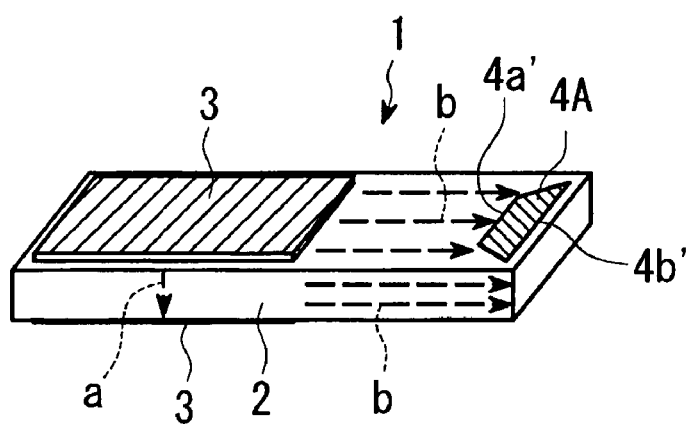
FIG. 1B is a diagram for explaining advantages of the present invention.

In here, it is not preferable to make the secondary side electrode 4 in a trapezoidal shape with its shorter side facing the inside and the longer side facing the outside as shown in FIG. 1B, because it makes the polarization conditions on the surface side and the inside in the output part not uniform.

Figure 6:
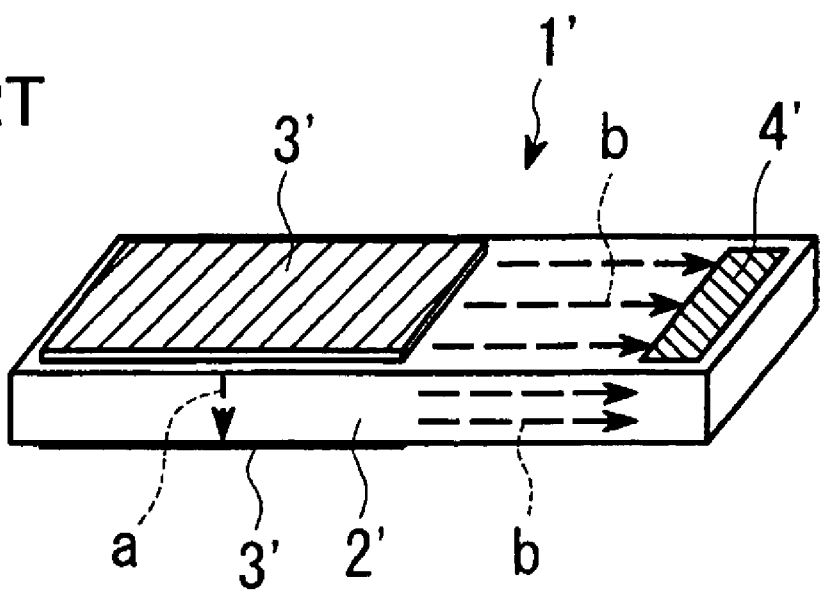
FIG. 6 shows a conventional piezoelectric transformer.

Meanwhile, as shown in FIG. 1A, when the secondary side electrode is formed into an approximately triangle shape, and the peak 4a is directed to the outside and the linear longer side 4b extending substantially in the width direction of the piezoelectric ceramics 2 is facing the inside, polarity on the output part side is not changed from the conventional one shown in FIG. 6, and it is possible to make the piezoelectric transformer have same characteristics.

Also, the secondary side electrodes 4 are not limited to the shape shown in FIG. 1A, and may have any other shape that the polarization direction a of the generating part is recognizable, i.e., that the polarity on the primary side of the piezoelectric ceramics 2 is recognizable.

Embodiment 2

Figure 2:
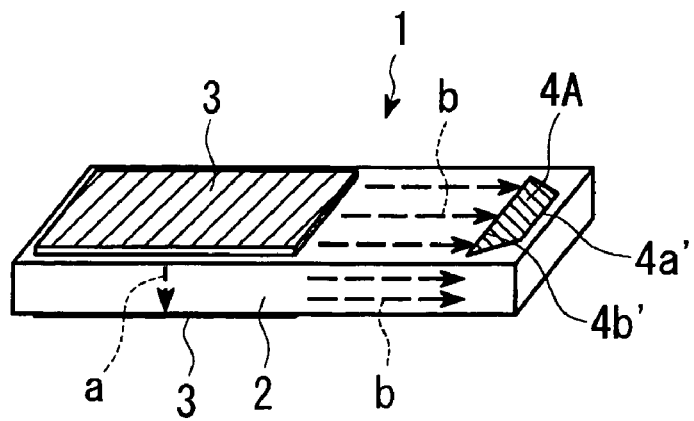
FIG. 2 is a perspective view of the piezoelectric transformer in a second embodiment of the present invention.

FIG. 2 shows a second embodiment of the present invention. In this embodiment, secondary side electrodes 4A are formed into an approximately trapezoidal shape, while bottom bases 4b' linearly extending along a width direction of the piezoelectric ceramics 2 are directed to the inside and top bases 4a' shorter than the bottom bases 4b' are directed to the outside.

In this manner, the inner ends of the secondary side electrodes 4, 4A are formed into a shape linearly extending along an approximately width direction of the piezoelectric ceramics 2, and outer ends are formed into a different and suitable shape, so that the polarization direction can be recognized by the shape of the outer end.

Embodiment 3

Figure 3:
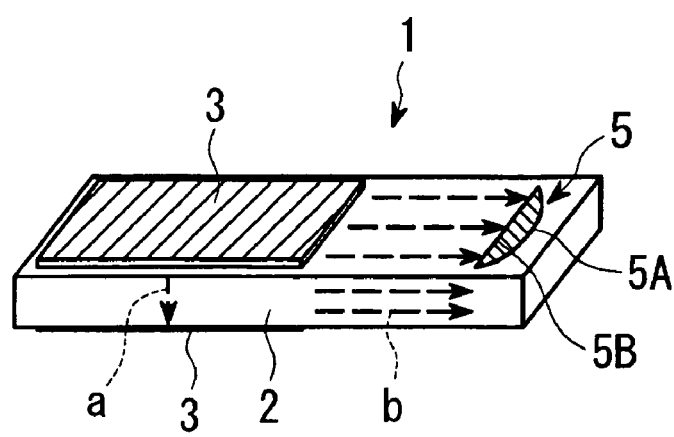
FIG. 3 is a perspective view of the piezoelectric transformer in a third embodiment of the present invention.

FIG. 3 shows a third embodiment of the present invention. In this embodiment, a secondary side electrode 5 on the top surface is formed into an arc shape surrounded by an arc 5A which is a part of a circle or a semicircle, and a chord 5B. That is to say, in the secondary side electrode 5, the chord 5B linearly extending along the width direction of the piezoelectric ceramics 2 is directed to the inside and the arc 5A is directed to the outside relative to the chord 5B.

In Embodiment 3, the polarity on the primary side of the piezoelectric ceramics 2 can be recognized by an arc shape of the secondary side electrode 5 on the top surface.

Embodiment 4

Figure 4:
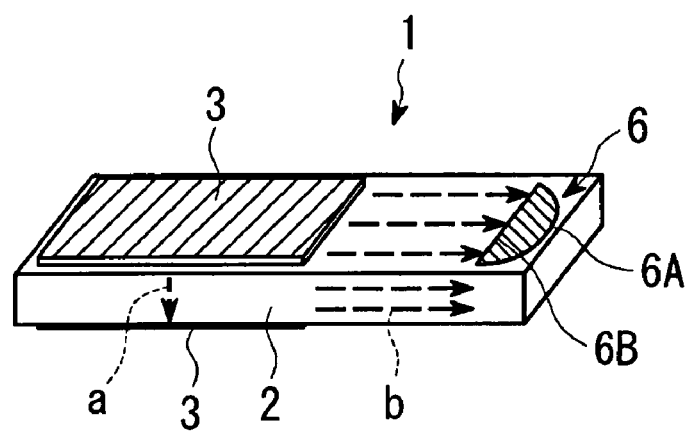
FIG. 4 is a perspective view of the piezoelectric transformer in a fourth embodiment of the present invention.

FIG. 4 shows a fourth embodiment of the present invention. In this embodiment, a secondary side electrode 6 on the top surface is formed into an oval arc shape surrounded by an oval arc 6A which is a part of an oval or a semi-oval, and a chord 6B. That is to say, in the secondary side electrode 6, the chord 6B linearly extending along the width direction of the piezoelectric ceramics 2 is directed to the inside, and the oval arc 6A is directed to the outside relative to the chord 6B.

In Embodiment 4, the polarity on the primary side of the piezoelectric ceramics 2 can be recognized by an oval arc shape of the secondary side electrode 6 on the top surface.

Embodiment 5

Figure 5:
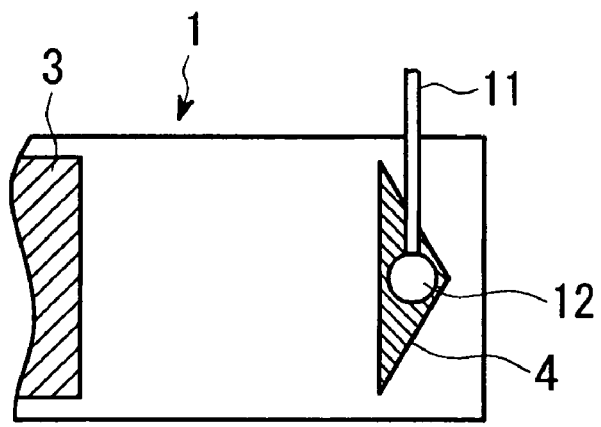
FIG. 5 is a plane view of the piezoelectric transformer in a fifth embodiment of the present invention.

In Embodiment 5, as shown in FIG. 5, when a lead wire 11 is connected with the secondary side electrode 4 of Embodiment 1 by a solder 12, the solder 12 is applied to a portion surrounded by three sides of the approximately triangular secondary side electrode 4, so that a volume of the solder 12 can be adjusted by the shape of the secondary side electrode 4. Thereby, poor vibrations generated by increasing the volume of the solder 12 can be reduced. In the case of applying the solder in Embodiments 2 to 4, the volume of the solder can be similarly adjusted by the shape of the secondary side electrode.

Embodiments 1 to 5 are described as above. In these embodiments, the secondary side electrode on the bottom surface has a square shape or a shape different from that of the secondary side electrode on the top surface.

Also, the present invention is not limited to the above-mentioned embodiments, and various changes can be made to the invention without departing from the sprit of the present invention. That is to say, a slit (not shown) may be formed, for example, on the secondary side electrode on the top surface on the inner sides of the secondary side electrodes 4, 4A, namely on the primary side electrode 3 side, so that the polarity can be recognized by existence of the slit. In this case, the solder is not applied on the slit portion, so that the volume of the solder can be adjusted. Accordingly, loads on the secondary side electrodes 4, 4A side can be reduced, so as to prevent breakage. In particular, a boundary between an area where the output part is polarized and an area where it is not polarized (outer end side) exists at a portion, in which the secondary side electrodes 4, 4A are provided. The boundary portion is structurally fragile, so that it is preferable that a slit 7 is provided at that portion, because loads are not applied to the portion.

What is claimed is:

1. A piezoelectric transformer, comprising a rectangular piezoelectric ceramic plate, a pair of primary side electrodes provided on both surfaces of one half input side of said plate, said input side being polarized in a thickness direction of the plate, and at least one secondary side electrode provided at an end of at least one surface of the other half output side of the plate, said output side being polarized in a lengthwise direction of the plate, wherein said secondary side electrode is formed into a shape visually recognizable of the direction of said polarity of said output side of the plate with respect to the input side, wherein an outer side shape of said formed secondary side electrode recedes from an inner side shape of said formed secondary side electrode.

2. A piezoelectric transformer, comprising a rectangular piezoelectric ceramic plate, a pair of primary side electrodes provided on both surfaces of one half input side of said plate, said input side being polarized in a thickness direction of the plate, and at least one secondary side electrode provided at an end of at least one surface of the other half output side of the plate, said output side being polarized in a lengthwise direction of the plate, wherein an inner side shape of said secondary side electrode is a linear shape extending substantially in a width direction of said rectangular piezoelectric ceramic plate, and an outer side shape of said secondary side electrode is configured differently than said inner side shape so as to recede from said inner side linear shape, said different configuration being a visually recognizable indication of the direction of polarity of said output side of the plate with respect to the input side and different from said linear inner shape.

* * * * *